(12) United States Patent
Lee et al.

(10) Patent No.: US 7,932,555 B2
(45) Date of Patent: Apr. 26, 2011

(54) TRANSISTOR STRUCTURE AND METHOD OF MAKING THE SAME

(75) Inventors: Pei-Ing Lee, Chang-Hua Hsien (TW); Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 412 days.

(21) Appl. No.: 11/949,788

(22) Filed: Dec. 4, 2007

(65) Prior Publication Data

US 2009/0020798 A1    Jan. 22, 2009

(30) Foreign Application Priority Data

Jul. 16, 2007   (TW) .............................. 96125850 A
Nov. 5, 2007   (TW) .............................. 96141711 A

(51) Int. Cl.
H01L 29/66    (2006.01)

(52) U.S. Cl. ........................ 257/330; 257/331; 257/332

(58) Field of Classification Search .................. 257/330, 257/331, 332
See application file for complete search history.

(56) References Cited

U.S. PATENT DOCUMENTS

| 6,476,444 | B1 | 11/2002 | Min | |
|---|---|---|---|---|
| 7,675,112 | B2 * | 3/2010 | Lee | 257/330 |
| 2006/0049455 | A1 * | 3/2006 | Jang et al. | 257/330 |
| 2008/0012067 | A1 * | 1/2008 | Wu | 257/330 |

FOREIGN PATENT DOCUMENTS

| CN | 1650437 A | 8/2005 |
|---|---|---|
| CN | 1877813 A | 12/2006 |

* cited by examiner

*Primary Examiner* — Phat X Cao
(74) *Attorney, Agent, or Firm* — Winston Hsu; Scott Margo

(57) ABSTRACT

A transistor structure includes a gate trench. The gate trench includes a bottle-shape bottom. The bottle-shape bottom includes a first conductive material wider than its top. The top includes a second material in a substrate, a gate structure on the gate trench and electrically connected to the first conductive material, a source/drain doping region adjacent to the gate trench and a gate channel between the source/drain doping region.

10 Claims, 13 Drawing Sheets

TRANSISTOR STRUCTURE AND METHOD OF MAKING THE SAME

BACKGROUND OF THE INVENTION

1. Field of the Invention

The present invention relates to a transistor structure. In particular, the present invention relates to the transistor structure with a wider bottom in the gate trench.

2. Description of the Prior Art

The transistor structure composed of the source, the gate and the drain is widely used in electronic products. The source/drain located respectively at the side of the gate are respectively electrically connected to the outside through the source/drain contact regions.

With the trend of the shrinkage of the critical dimension (CD), the space for forming the source/drain contact regions decrease dramatically. Taking the transistor structure of line width of 40 nm in the conventional process for example, the remaining width for forming the source/drain contact regions may be as little as 30 nm. When operational errors such as lithographic and alignment errors are taken into consideration, it is extremely difficult to form the source/drain contact regions of 30 nm width. Once the source/drain region has bad contact, its operational performance will be seriously jeopardized.

Therefore, it is needed to provide a novel transistor structure with sufficient source/drain contact regions in a smaller unit to maintain the operational performance.

SUMMARY OF THE INVENTION

The present invention provides a transistor structure with sufficient source/drain contact region width in a smaller unit. The transistor structure may ensure the operational performance of the transistor by making the best of the chip space.

The transistor structure of the present invention includes a gate trench, a gate structure, a source/drain doping region, a gate channel and a dielectric layer. The gate trench in a substrate includes a top of first width and with a first conductive layer as well as a bottle-shape bottom of a second width and with a second conductive layer. The first width is smaller than the second width. The gate structure is on the gate trench and electrically connected to the first conductive layer. The source/drain doping region is in the substrate and adjacent to the gate trench. The gate channel is between the source/drain doping region. The dielectric layer covers the gate structure and the source/drain doping region.

The present invention further provides a method for forming a transistor structure including:
providing a substrate with a bottom layer and a top layer as well as a deep trench in the substrate;
performing a selective wet etching to enlarge the deep trench to be a gate trench including a top of a first width and a bottle-shape bottom of a second width, the first width being smaller than the second width;
depositing a dielectric layer to cover the gate trench;
forming a first conductive layer partially filling the gate trench and a second conductive layer filling the gate trench so that the first conductive layer is electrically connected to the second conductive layer; and
removing the bottom layer and the top layer to form a gate structure and a source/drain doping region to complete the transistor structure, wherein the gate structure is above the gate trench and electrically connected to the second conductive layer, the source/drain doping region is in the substrate and disposed respectively on both sides of the gate trench. The gate channel is between the source/drain doping region.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a transistor structure with sufficient width/area of the source/drain contact region in a smaller unit. The transistor structure may ensure the operational performance of the transistor by making the best of the chip space.

The present invention provides a method for forming a transistor structure. FIG. 1 to FIG. 6 illustrate the method for forming the transistor structure. Please refer to FIG. 1, the present invention first provides a substrate 210 with a bottom layer 211 and a top layer 212. The bottom layer 211 may be a conventional pad oxide layer and the top layer 212 may be a conventional pad nitride layer. The substrate 210 suitable for the transistor structure 200 of the present invention may be a semiconductor substrate of a pre-determined lattice orientation, such as Si or Ge.

Figure 1:
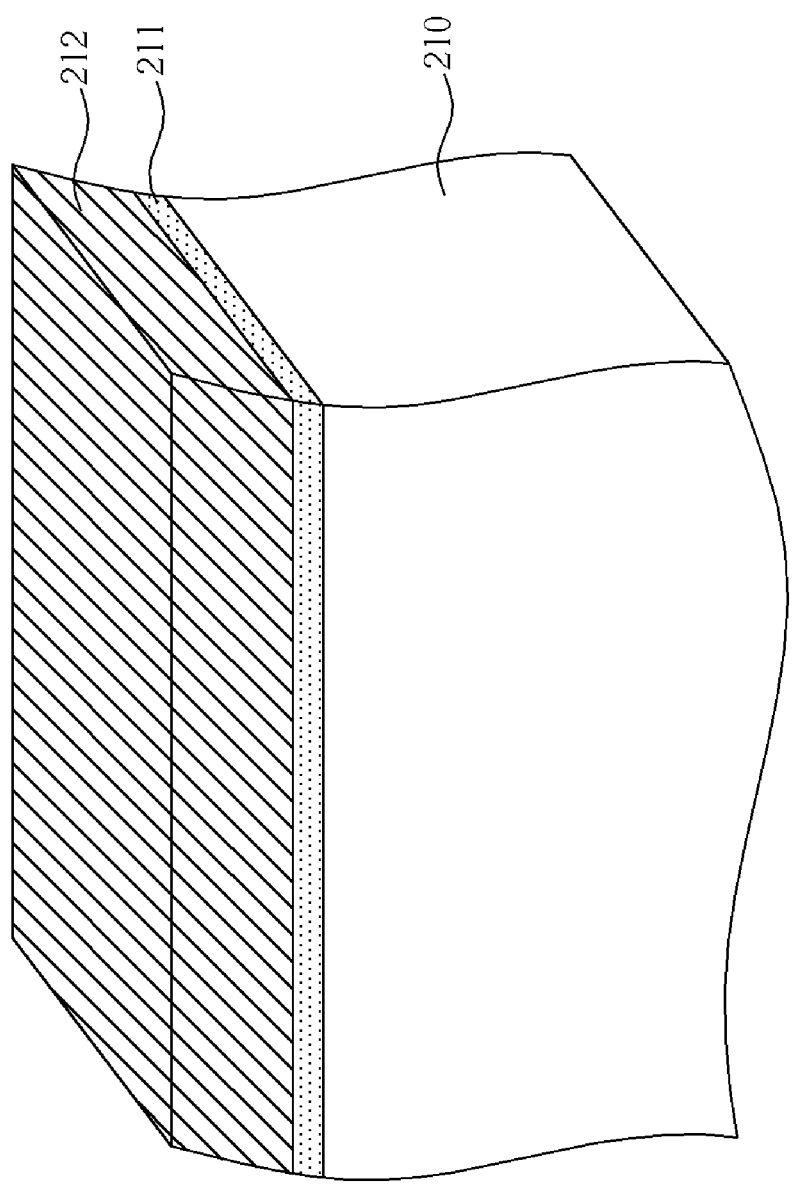
FIG. 1 to FIG. 6 illustrate the method for forming the transistor structure.
Figure 2:
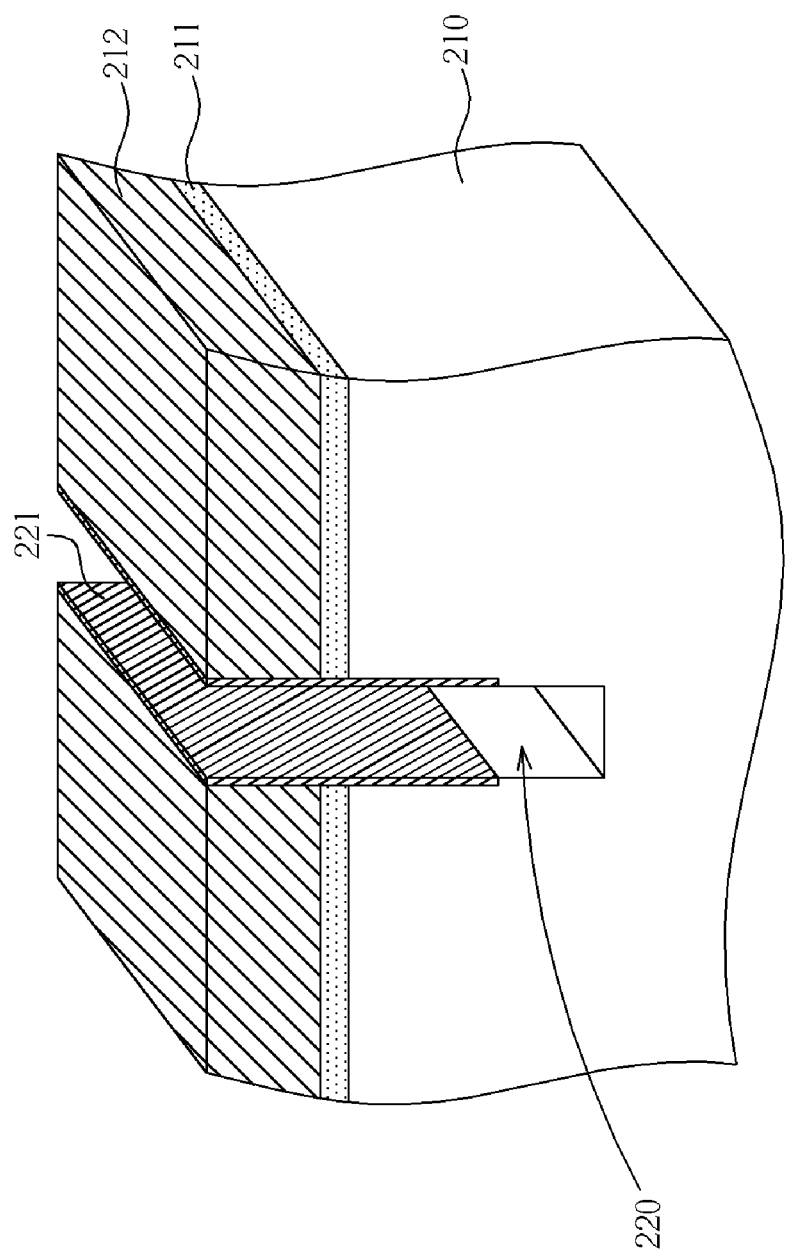
Figure 2A:
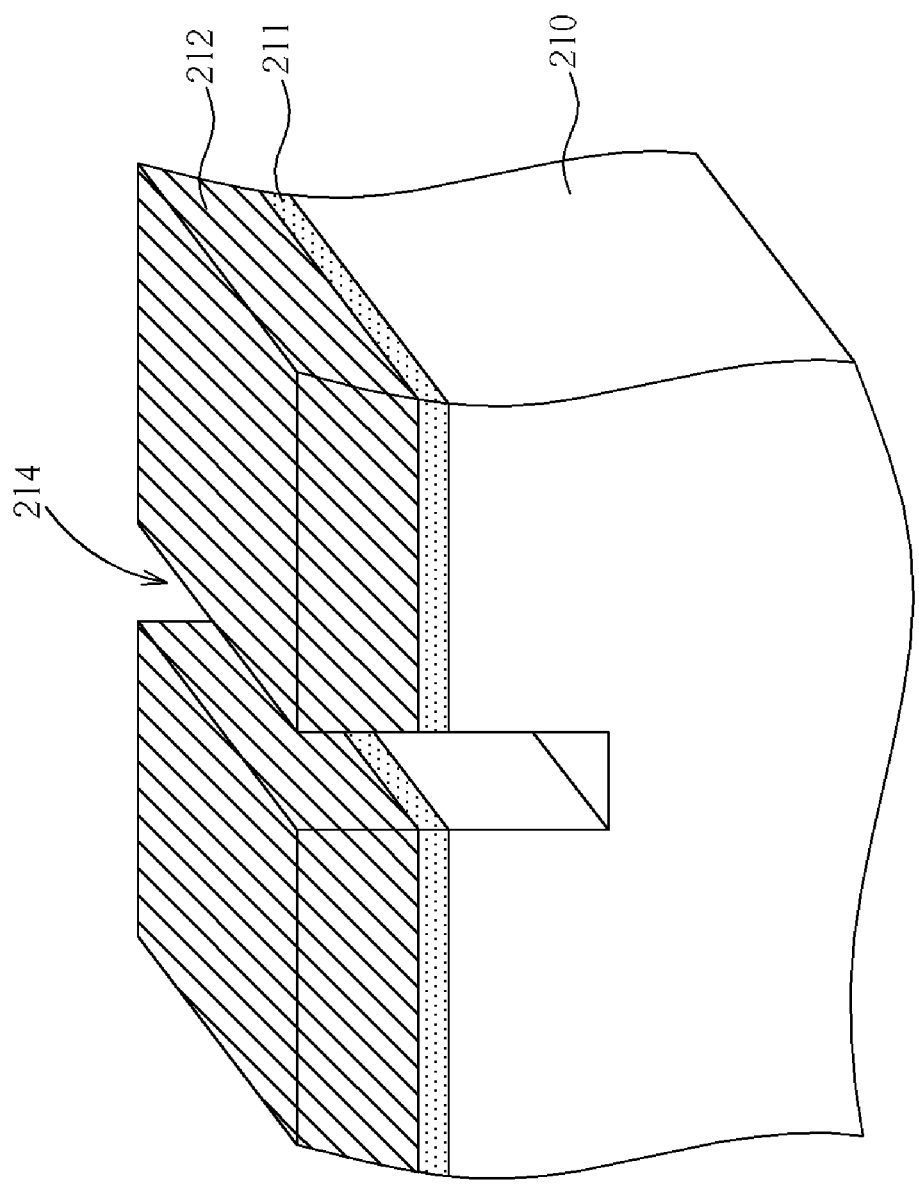
Figure 2B:
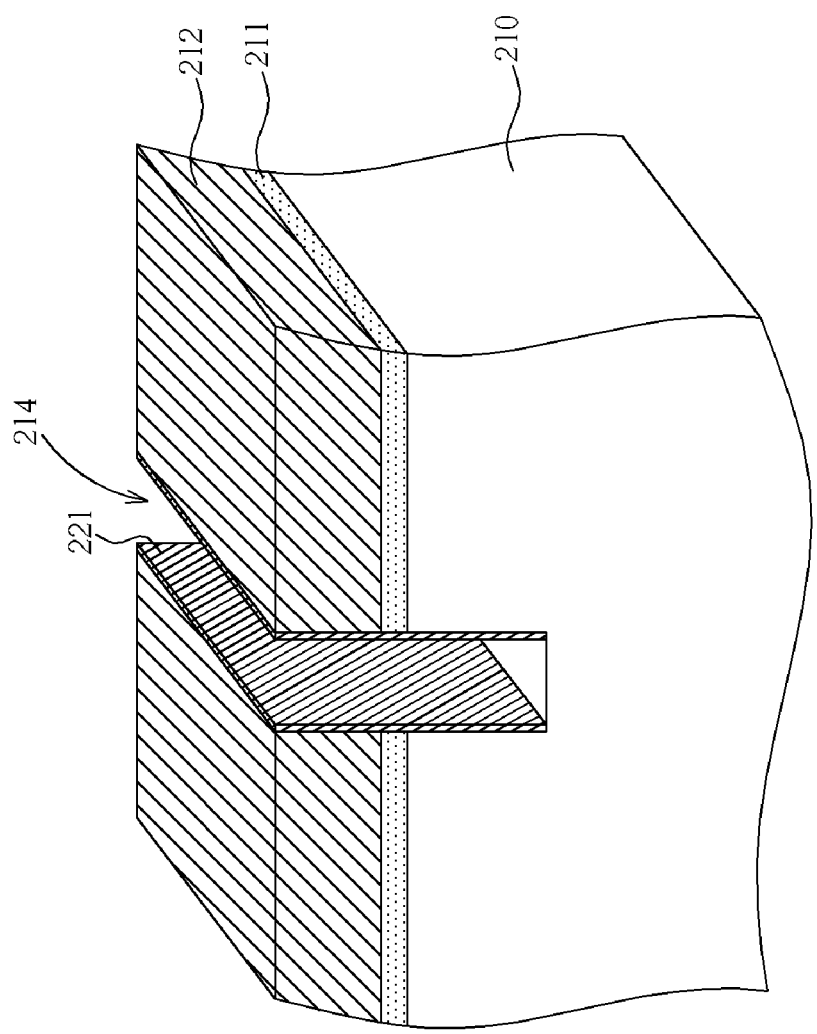
Figure 2C:
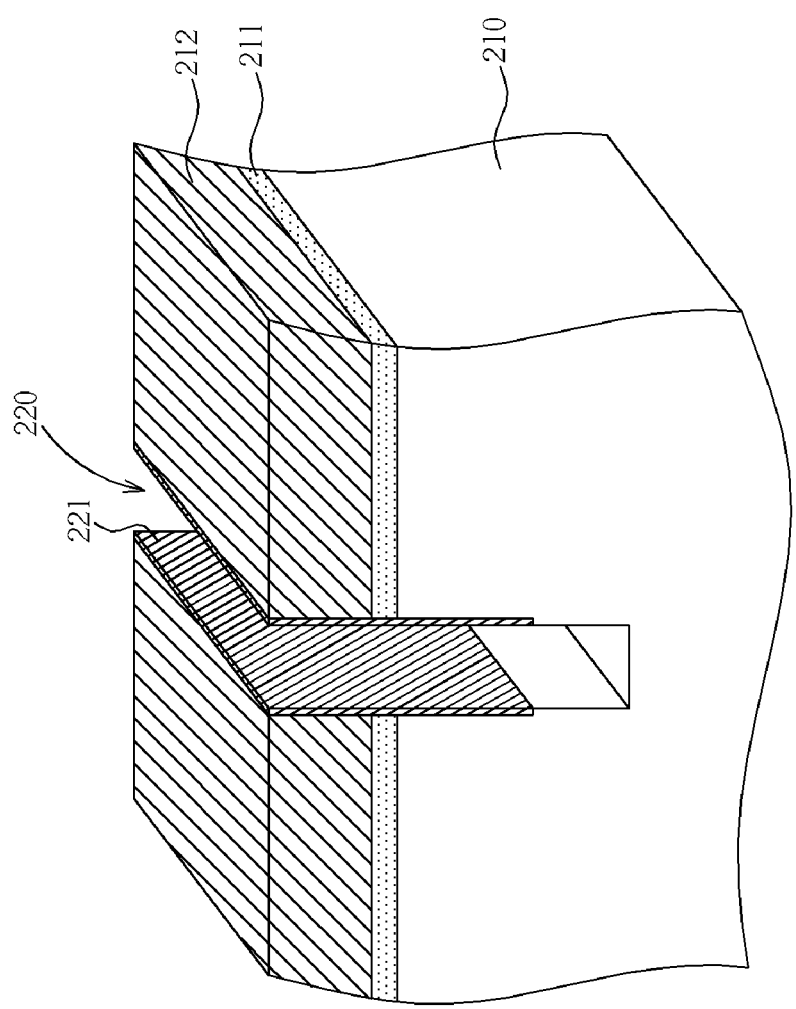

Please refer to FIG. 2, a deep trench 220 and a passivation layer 221 are formed in the substrate 210. The depth of the deep trench 220 is optional, 2000 Å-3000 Å for example. For instance, the procedure of forming the deep trench 220 may be as follows. First, please refer to FIG. 2A, the procedure performs a first dry etching to etch the top layer 212, bottom layer 211 and substrate 210 to form a recess 214. Then, please refer to FIG. 2B, a passivation material is selectively deposited to form a passivation layer 221 vertically covering the top layer 212, bottom layer 211 and substrate 210 in the recess 214. Later, please refer to FIG. 2C, the recess 214 which is not protected by the passivation layer 221 is etched using the passivation layer 221 as an etching mask to form the deep trench 220. Preferably a deep trench of two-step depth is accordingly formed.

Figure 3:
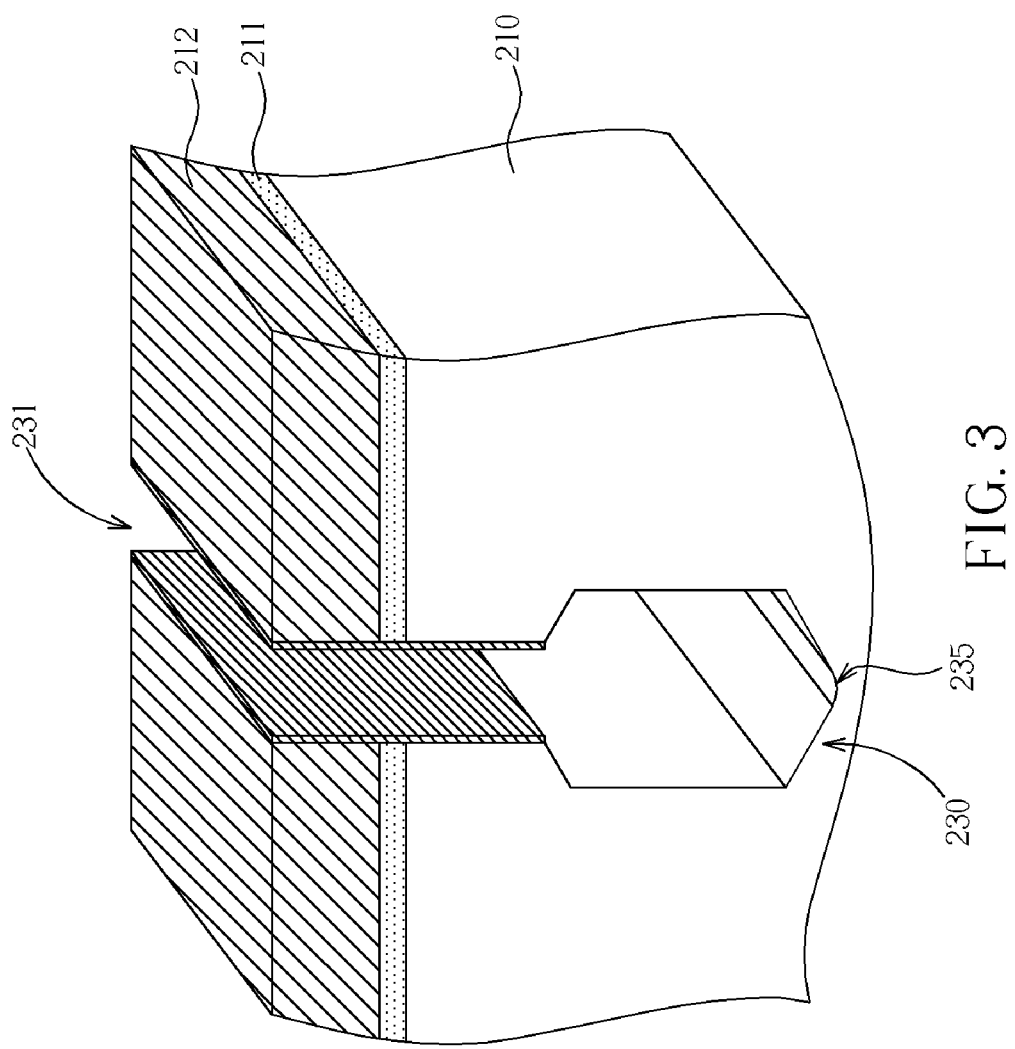
Figure 4:
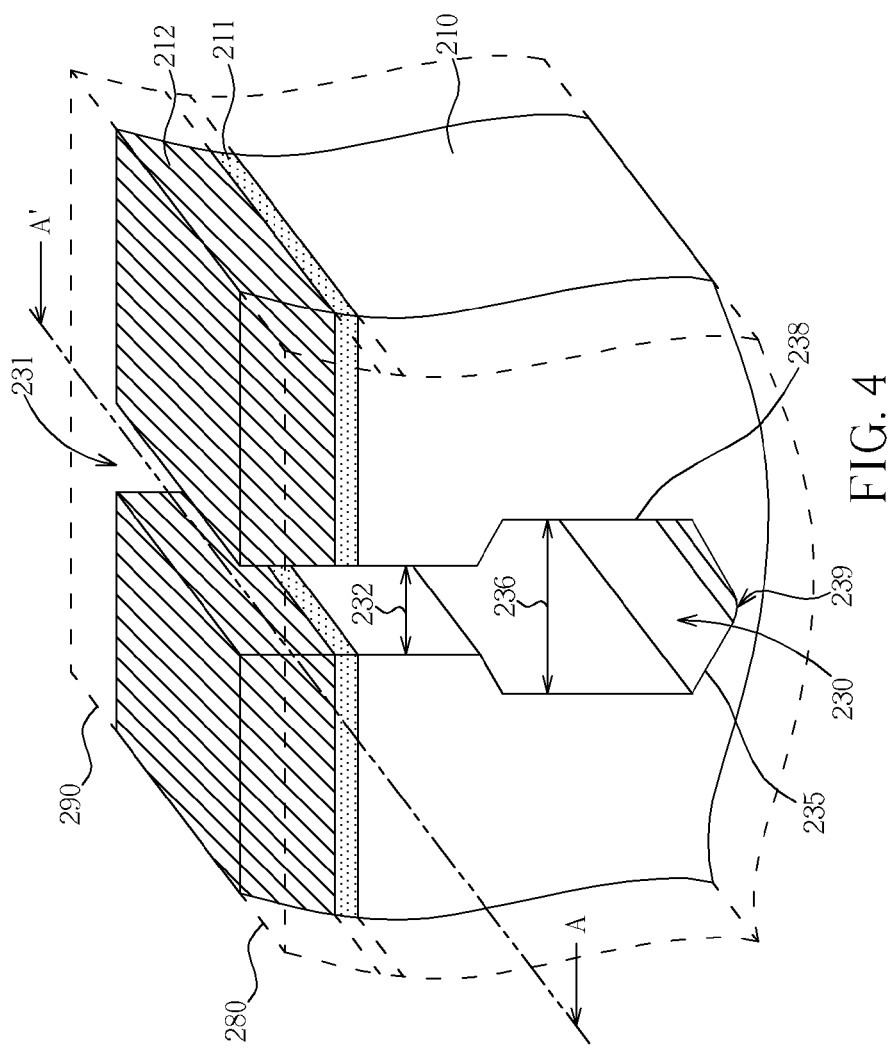
Figure 7:
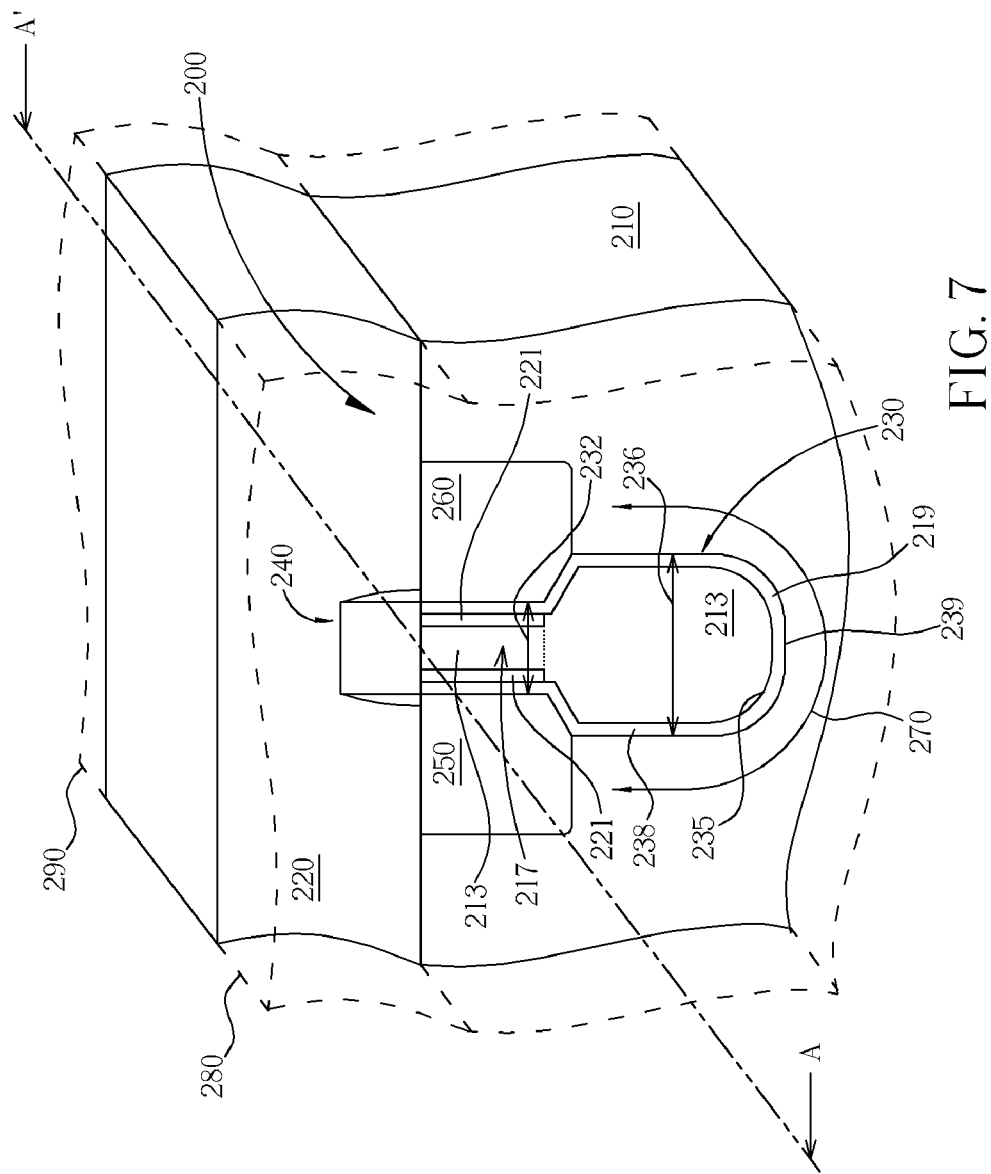
FIG. 7 illustrates a preferred embodiment of the transistor structure of the present invention.

Please refer to FIG. 3, a selective wet etching is performed to enlarge the deep trench 220 to be a gate trench 230 including a top 231 and a bottle-shape bottom 235. For example, a mask of a passivation layer 221 formed on the walls of the deep trench 220 by the earlier atomic layer deposition is used to perform a selective wet etching using an alkaline etchant to enlarge the deep trench 220 which is not covered by the passivation layer 221 to be a gate trench 230, and later the passivation layer 221 is removed, as shown in FIG. 4. The alkaline etchant may independently include aqueous ammonia or KOH. If the substrate 210 is a Si or Ge substrate of lattice (110), the alkaline etchant may form a vertical sidewall 238 and a U-shaped tip 239 along this orientation. Afterwards a dry etching or a thermal oxidation may be optionally employed to round the U-shaped tip 239, as shown in FIG. 7.

The depth of the gate trench 230 is optional, 2000 Å for example. The first width 232 of the top 231 is usually smaller than the second width 236 of the bottle-shape bottom 235, i.e.

not greater than 50 nm, 40 nm or half of the second width 236 for example. The bottle-shape bottom 235 may extend to both sides, so that the second width 236 is greater than the first width 232, for example, to an extent of 20 nm at each side.

Figure 4A:
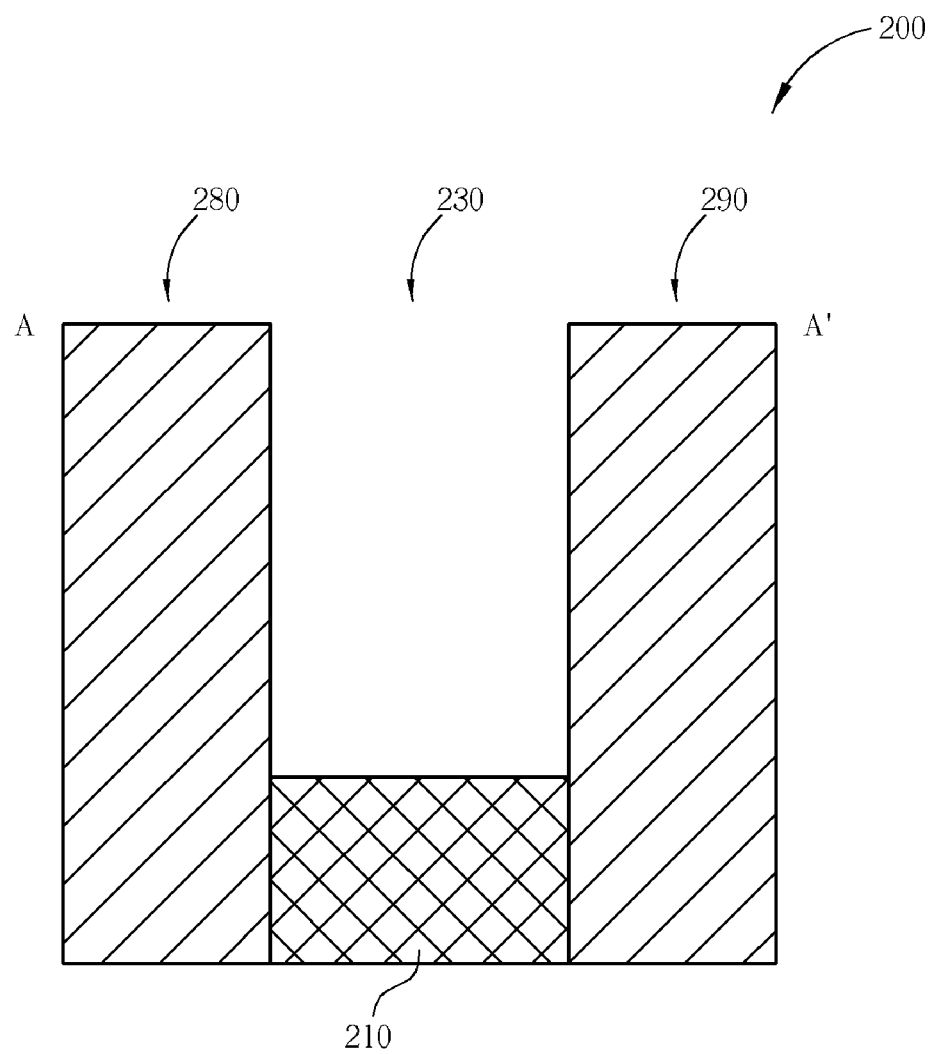
FIG. 4A-4C illustrate a preferred embodiment of the present invention of a cross-section view according to A-A' line in FIG. 4.

Please refer to FIG. 4A, illustrating a preferred embodiment of the present invention, which is a cross-section view according to A-A' line in FIG. 4. There may be a first shallow trench isolation 280 and a second shallow trench isolation 290 parallel with each other formed prior to the formation of the deep trench 220 along the both sides of the A-A' line in the substrate 210, the top layer 212, the bottom layer 211.

Figure 4B:
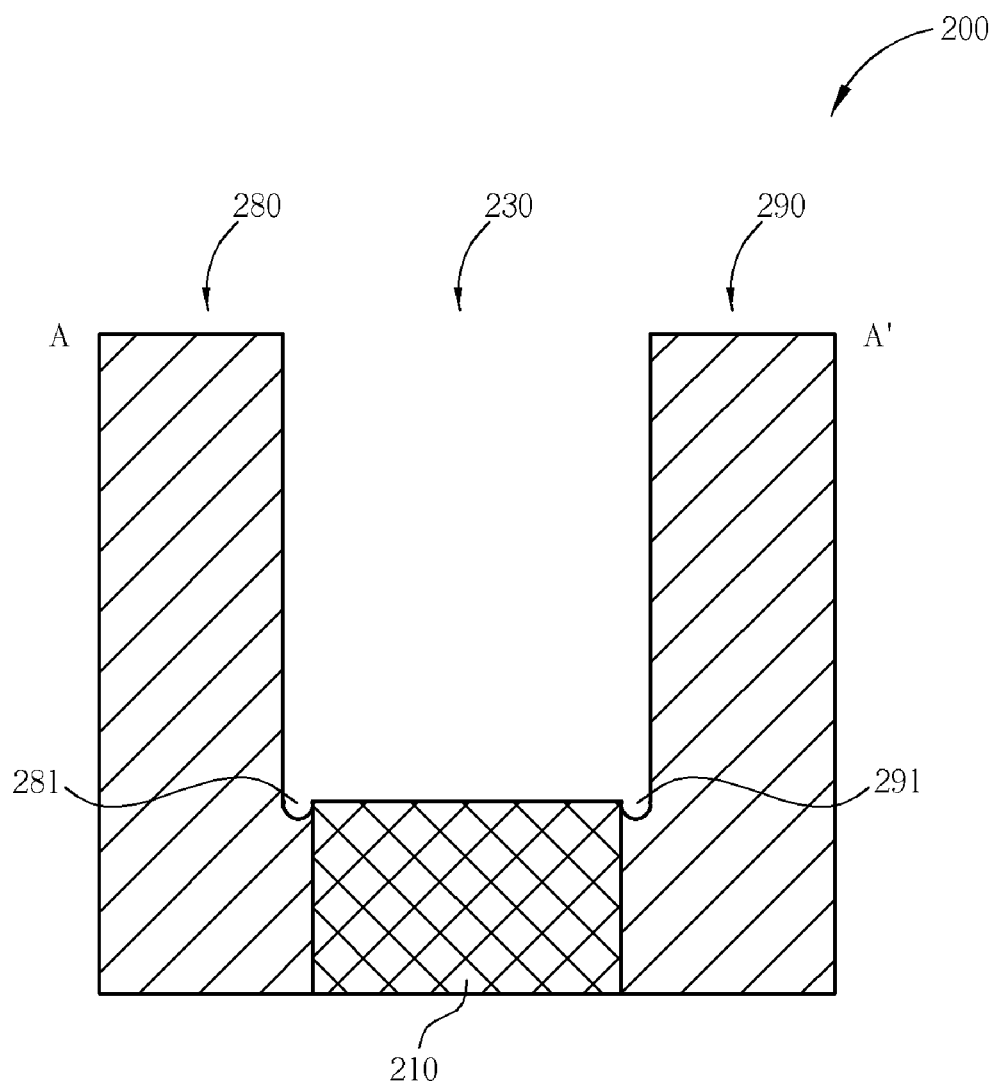

Please refer to FIG. 4B, after the deep trench 220 is enlarged to form the gate trench 230, optionally the exposed part of the first shallow trench isolation 280 and the second shallow trench isolation 290 may be wet-etched by a fluoro-containing etchant to respectively form a first recess 281 and a second recess 291.

The fluoro-containing etchant may be a buffered HF or a dilute HF. Because the shallow trench isolation is usually made of silicon oxide, the exposed part of the first shallow trench isolation 280 and the second shallow trench isolation 290 may respectively form the curved first recess 281 and the curved second recess 291 by the fluoro-containing etchant. However, the influence of the fluoro-containing etchant on the substrate is relatively less noticeable.

Figure 4C:
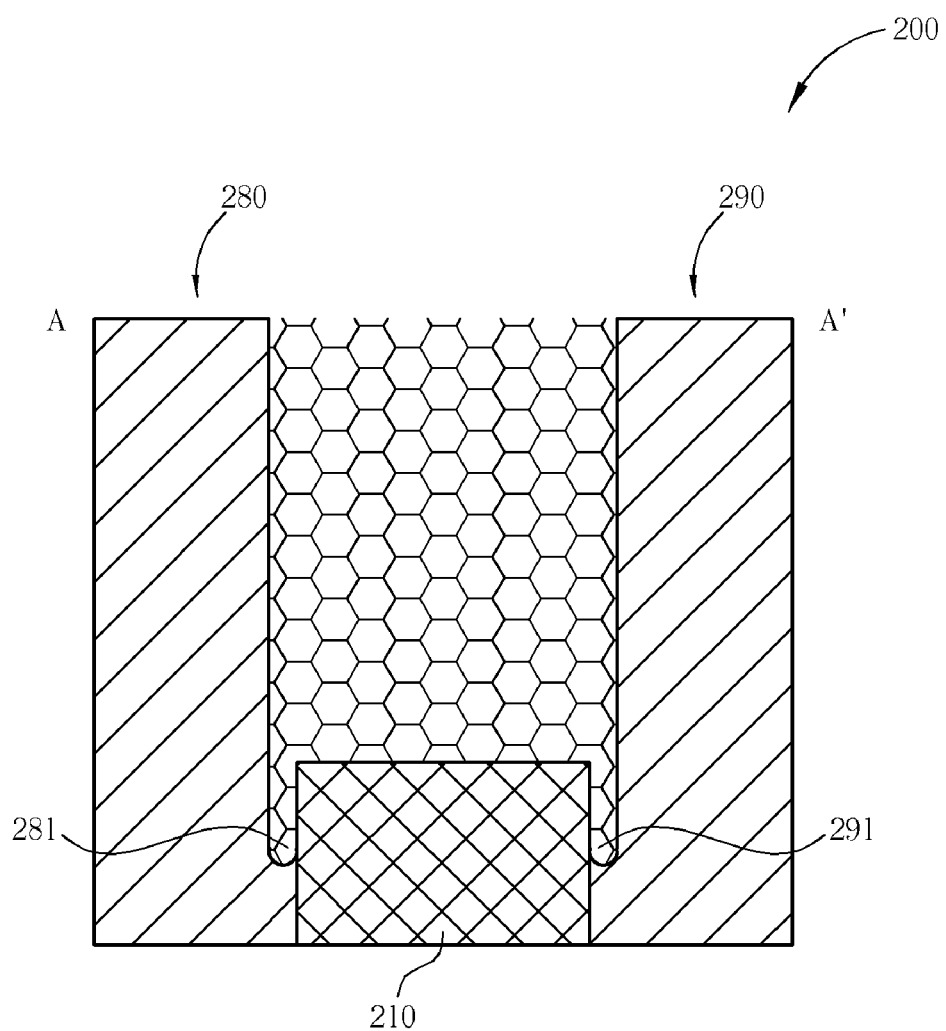

Preferably, the first recess 281, the second recess 291 and the gate trench 230 may happen to joint together to form a fin-type structure to increase the surface area of the gate trench 230, so that the later filled conductive material may surround part of the substrate 210, as shown in FIG. 4C.

Figure 5:
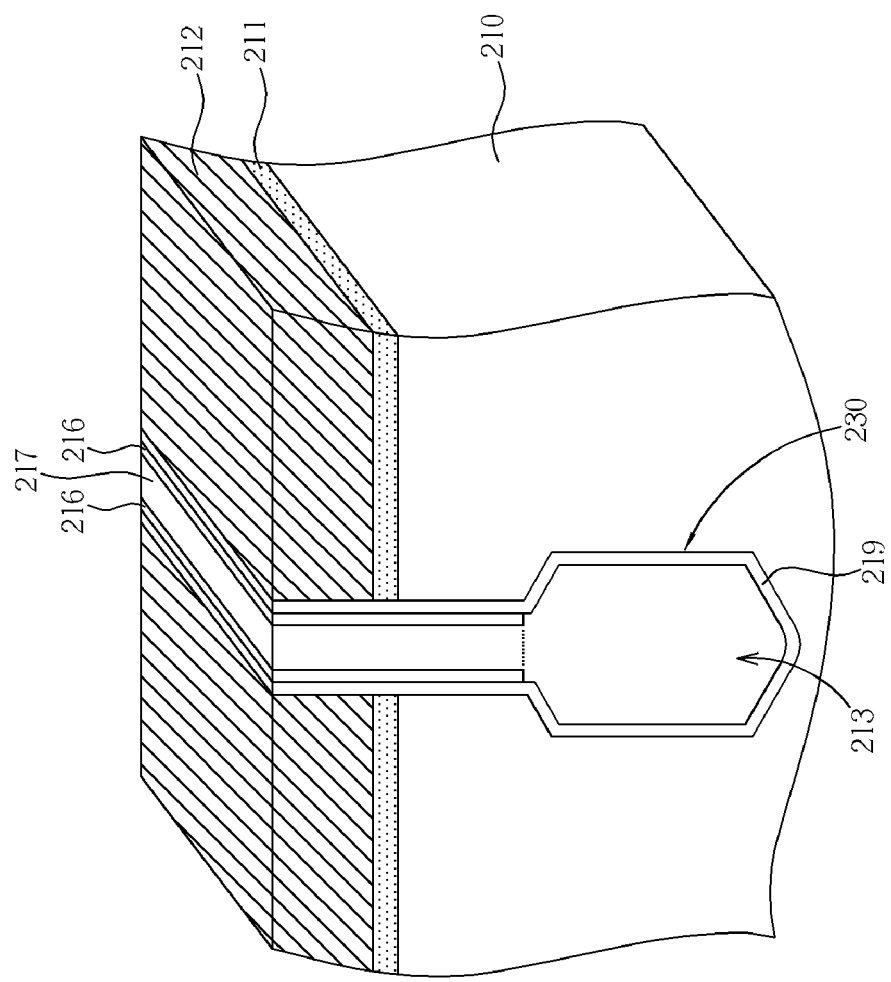

Please refer to FIG. 5, a gate dielectric layer 219 is deposited to cover the gate trench 230, and further a first conductive layer 213 is formed to fill the gate trench and a second conductive layer 217 is formed to fill the gate trench and electrically connected to the first conductive layer 213. The first conductive layer 213 and the second conductive layer 217 may be the same or different conductive material(s), for example Si, C or metal such as Cu, Al or W.

For example, the method for forming the first conductive layer 213 may be as follows. First the gate trench 230 may be filled with a conductive material then the conductive material may be back-etched to a pre-determined depth so that the first conductive layer 213 partially fills the gate trench 230. Later the gate trench 230 is filled with a second conductive material 217. Optionally, before the second conductive layer 217 is formed, a collar dielectric layer 216 may be formed at the top 231.

Figure 6:
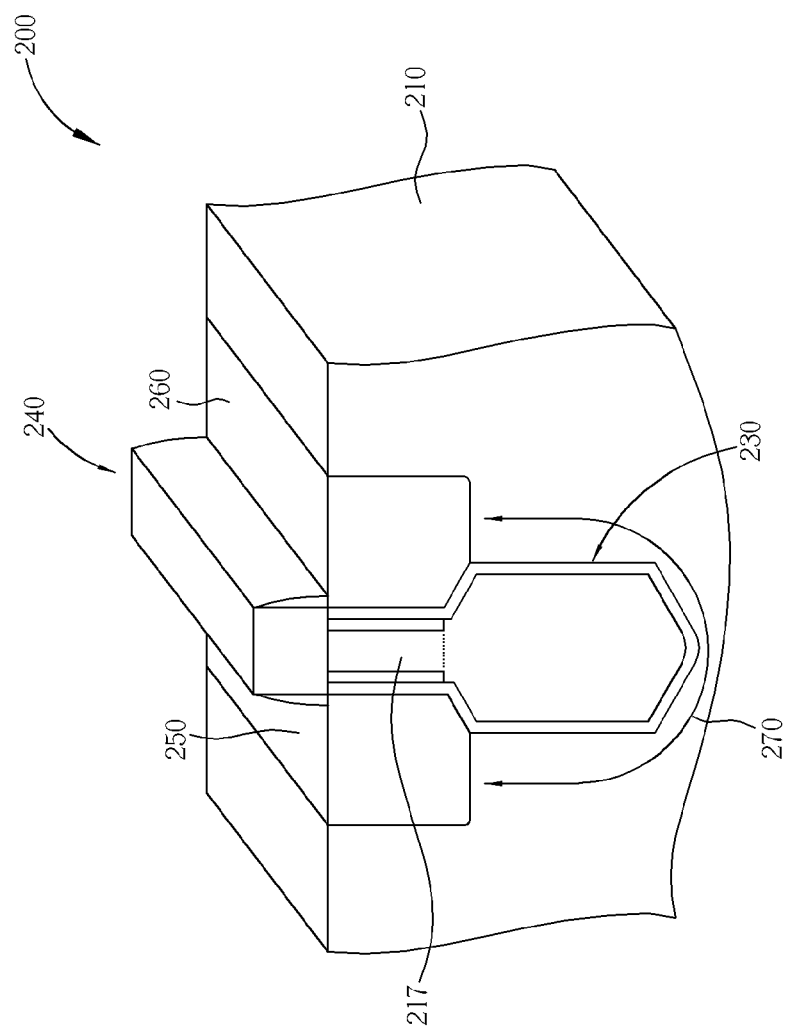

Please refer to FIG. 6, after the bottom layer 211 and the top layer 212 are removed, the gate structure 240, the source doping region 250 and the drain doping region 260 are formed to complete the transistor structure 200. The gate structure 240 is above the gate trench 230 and electrically connected to the second conductive layer 217. The source doping region 250 and the drain doping region 260 are in the substrate 210 and respectively adjacent to one side of the gate trench 230. For example, the top layer may be removed by using phosphoric acid and the bottom layer may be removed by using HF. If necessary, an interlayer dielectric layer (not shown) may cover the gate structure 240, the source doping region 250 and the drain doping region 260. The depth or the concentration of the dopants of the source doping region 250 and the drain doping region 260 are usually different.

The gate channel 270 is between the source doping region 250 and the drain doping region 260. If the vertical sidewall 238 is formed along the orientation (110), it is one of the features of the present invention that the resistance of the gate channel 270 may be reduced. On the other side, because the fin-type structure increases the surface area of the gate trench, it may additionally increase the controllability over the gate channel 270. This may still be another feature of the present invention.

Because the gate trench 230 of the present invention has a narrower top 231 compared with the conventional ones, the source doping region 250 and the drain doping region 260 may have more spacious room for contact regions. For example, the top 231 may shrink as much as 20 nm respectively from the source doping region 250 and the drain doping region 260, so that the current source/drain contact regions of 30 nm width may add about 50% more space.

By carefully controlling the formation of the gate trench 230, the bottle-shape bottom 235 may have universal shape and dimension and accordingly the length of the gate channel 270 may be in conformity with one another. On one hand the short channel effect may be avoided, and on the other hand another feature of the present invention is all transistors may have consistent performance.

The method for forming a transistor structure of the present invention may further include the formation of a dynamic random access memory (DRAM) unit together with a capacitor electrically connected to the drain doping region 260, or covering a dielectric layer 220 on the transistor structure, but is not limited to this. The capacitor may be a deep trench capacitor or a stack capacitor.

FIG. 7 illustrates a preferred embodiment of the transistor structure of the present invention. The transistor structure 200 of the present invention includes a substrate 210, a gate trench 230, a gate structure 240, a source doping region 250, a drain doping region 260 and a gate channel 270. In addition, the transistor structure 200 is also covered by a dielectric layer 220. There may be a first shallow trench isolation 280 and a second shallow trench isolation 290 parallel with each other along the both sides of the A-A' line.

The gate trench 230 in the substrate 210 includes a top 231 and a bottle-shape bottom 235. The gate structure 240 is on the gate trench 230. The bottle-shape bottom 235 may preferably include a vertical sidewall 238 and a U-shaped tip 239. The top 231 may preferably include a collar dielectric layer 216. There may be a gate dielectric layer 219 on the bottle-shape bottom 235.

The top 231 of a first width 232 may include a first conductive layer 213 and the bottle-shape bottom 235 of a second width 236 may include a second conductive layer 217. Generally speaking, the first width 232 is smaller than the second width 236. In addition, the first conductive layer 213 is electrically connected to the second conductive layer 217, and the gate structure 240 is electrically connected to the first conductive layer 213. The first conductive layer 213 and the second conductive layer 217 may be the same or different conductive materials, for example Si, C or metal such as Cu, Al or W.

Generally speaking, the first width 232 of the top 231 may be about the same as the width of the gate structure 240, but the bottle-shape bottom 235 may have a wider width 236. Preferably, the first width 232 is about half of the second width 236. The width of the gate structure 240 is usually associated with the critical dimension (CD) of the elements. For example, if the gate structure 240 has a width of 40 nm, the first width 232 of the top 231 may usually not be greater than 50 nm, about 40 nm. The bottle-shape bottom 235 may preferably extend to both sides, so that the second width 236 is greater than the first width 232, for example, to an extent of 20 nm at each side.

The source doping region 250 and the drain doping region 260 are disposed in the substrate 210 and on one side of the gate trench 230. Because the gate trench 230 of the present invention has a narrower top 231 compared with the conventional ones, the source doping region 250 and the drain doping region 260 may have more spacious room for contact regions. For example, the top 231 may shrink as much as 20 nm respectively from the source doping region 250 and the drain doping region 260, so that the current source/drain contact regions of 30 nm width may add about 50% more space.

The gate channel 270 is in the substrate and between the source doping region 250 and the drain doping region 260. The dielectric layer 220 covers the gate structure 240, source doping region 250 and the drain doping region 260. If the substrate 200 is a Si or Ge substrate of lattice (110), the vertical sidewall 238 may preferably extend along this orientation to reduce the resistance of the gate channel 270.

By carefully controlling the formation of the gate trench 230, the bottle-shape bottom 235 may have universal shape and dimension, and accordingly the length of the gate channel 270 may be in conformity with one another. On one hand the short channel effect may be avoided, and on the other hand another feature of the present invention is all transistors may have consistent performance.

Those skilled in the art will readily observe that numerous modifications and alterations of the device and method may be made while retaining the teachings of the invention.

What is claimed is:

1. A transistor structure comprising:
   a substrate having a pre-determined lattice orientation;
   a gate trench defined in said substrate and composed of a top portion with a first width and a bottom portion communicating with the top portion and provided with a second width being larger than said first width, wherein said bottom portion comprises a vertical sidewall which is vertical to the top surface of said substrate, a bulged substrate and only one exclusive wedge-shaped bottom with only one exclusive U-shaped tip;
   a gate dielectric layer formed on a surface of said bottom portion of said gate trench and of even thickness;
   a conductive material filled in said gate trench, surrounding said bulged substrate and enclosed by said gate dielectric layer in said bottom portion; and
   a gate structure formed in said gate trench and electrically connected to said conductive material.

2. The transistor structure of claim 1 further comprising a collar insulator formed on a surface of said top portion of said gate trench.

3. The transistor structure of claim 2, wherein said conductive material filled in said gate trench is surrounded by said collar insulator in said top portion of said gate trench.

4. The transistor structure of claim 3 further comprising a source region and a drain region formed in said substrate, wherein said source region and drain region are on two opposed sides of said gate trench such that being the second width larger than the first width, a channel length to be formed between the source region and the drain region is increased.

5. The transistor structure of claim 2, wherein said substrate further comprising a first shallow trench isolation and a second shallow trench isolation parallel with each other, and said gate trench is formed in the substrate between said first and second shallow trench isolation.

6. The transistor structure of claim 5, wherein a bottom of each of said first and second shallow trench isolation is lower than a bottom of said gate trench, such that said bottom portion of said gate trench together with said bulged substrate form a fin structure.

7. The transistor structure of claim 5, wherein said transistor structure forms a dynamic random access memory (DRAM) unit together with a capacitor.

8. The transistor structure of claim 6, wherein said capacitor is a deep trench capacitor.

9. The transistor structure of claim 6, wherein said capacitor is a stack capacitor.

10. The transistor structure of claim 1, wherein said vertical sidewall of the bottom portion of said gate trench extends along said substrate of said pre-determined lattice orientation.

* * * * *